United States Patent [19]
Kwon

[11] Patent Number: 5,774,399
[45] Date of Patent: Jun. 30, 1998

[54] FLASH MEMORY DEVICE

[75] Inventor: Gyu Wan Kwon, Ichon, Rep. of Korea

[73] Assignee: Hyundai Electronics Industries, Co., Ltd., Kyungki-Do, Rep. of Korea

[21] Appl. No.: 730,874

[22] Filed: Oct. 18, 1996

[30]     Foreign Application Priority Data

Oct. 18, 1995 [KR] Rep. of Korea ...................... 95-35938

[51] Int. Cl.⁶ .............................. G11C 11/34; G11C 7/00
[52] U.S. Cl. ............................... 365/185.18; 365/185.29; 365/185.33; 365/218; 365/226
[58] Field of Search ........................ 365/185.18, 185.29, 365/185.33, 218, 226

[56]              References Cited

U.S. PATENT DOCUMENTS 5,384,742   1/1995   Miyakawa et al. ...................... 365/218
5,399,928   3/1995   Lin et al. ................................ 327/434
5,513,146   4/1996   Atsumi et al. ...................... 365/185.18
5,612,913   3/1997   Cappelletti et al. ............... 365/185.18

*Primary Examiner*—David C. Nelms
*Assistant Examiner*—Trong Phan
*Attorney, Agent, or Firm*—Fish & Richardson P.C.

[57]               ABSTRACT

The present invention relates to a flash memory device and is constructed in such a way that the memory cell blocks are sequentially selected according to the input of the erasing signal and the output voltage of the negative charge pump is supplied only to the selected memory cell block to prevent the degradation of the operational performance of the device due to excessive load applied to the output terminal of the negative charge pump at the time of erase operation. Therefore, the present invention relates to a flash memory device in which the magnitude of the load applied to the output terminal of the negative charge pump is effectively reduced and accordingly, the degradation of operational performance of the device can be prevented.

13 Claims, 4 Drawing Sheets

FLASH MEMORY DEVICE

BACKGROUND OF INVENTION

1. Field of the Invention

The present invention relates to a flash memory device and, more particularly, to a flash memory device which can reduce the magnitude of a load taking in an output terminal of a negative charge pump.

2. Information Disclosure Statement

In general, a flash memory device has functions of electrically programming and erasing. A conventional flash memory device is described below with reference to FIG. 1.

The conventional flash memory device is composed of a memory cell array 11 composed of a plurality of memory cells and a peripheral circuit(not shown) as shown in FIG. 1. In erasing operation, a negative voltage is supplied from a negative charge pump 12 to the memory cell array 11. Since the conventional flash memory device is constructed in such a way that all the memory cells existing in the memory cell array 11 are concurrently erased, a large load is applied to an output terminal of the negative charge pump 12 in the erasing operation, and accordingly the operational performance of the device is degraded due to the change in the output negative voltage. Therefore, when the degree of integration of the flash memory device is increased, the size of the negative charge pump 12 must be increased and this serves as a factor which makes the high degree of integration of the device difficult.

SUMMARY OF THE INVENTION

Therefore, it is the object of the present invention to provide a flash memory device which can solve the above described disadvantages by constructing the flash memory device in such a way that memory cell blocks are sequentially selected according to the input of erasing signals and the output voltage of the negative charge pump is supplied only to the selected memory cell block.

A flash memory device according to the present invention to accomplish the above described object is characterized in that it comprises: a memory cell array composed of a plurality of memory cell blocks; a negative charge pump; a plurality of switching circuits connected between said negative charge pump and said memory cell blocks; a plurality of local pump circuits for operating said plurality of switching circuits; and a block selection circuit for sequentially operating said local pump circuits according to the input of an erasing signal.

Another flash memory device according to the present invention is characterized in that it comprises: a memory cell array composed of a plurality of memory cell blocks; a negative charge pump; a plurality of switching circuits connected between said negative charge pump and said memory cell blocks; a plurality of local pump circuits for operating said plurality of switching circuits; a clock generator for outputting a clock signal and an erase completion signal according to the input of block erase completion signal; a block selection circuit for sequentially operating said local pump circuits according to the input of an erasing signal and said clock signal.

Further, said local pump circuit is characterized in that is comprises: a first and second transistors constructed to be operated by diodes between output terminals of said negative charge pump; an eighth NAND gate which take as inputs an output signal of said block selection circuit and a first pulse signal; a first capacitor connected between the gate terminal of said first transistor and the output terminal of said eighth NAND gate; a ninth NAND gate which takes as inputs an output signal of said block selection circuit and a second pulse signal; and a second capacitor connected between the gate terminal of said second transistor and the output terminal of said ninth NAND gate.

Said clock generator is characterized in that is comprises: a fourth inverter gate which takes as an input said block erase completion signal; a NOR gate which takes as inputs the output signal of said fourth inverter gate and a reference clock signal; a fifth inverter gate which takes as an input the output signal of said NOR gate and outputs a clock signal; a seventh NAND gate which takes as inputs said block erase completion signal and fourth output signal; a sixth inverter gate which takes as an input the output signal of said seventh NAND gate and outputs said erase completion signal; a pulse generation portion which takes as an input said block erase signal; and a status counter for sequentially outputting an erase progress signal, an erase verification signal and an erase comparison signal according to the output signal of said pulse generation portion.

Said block selection circuit is characterized in that is comprises: an erasing signal detection circuit for generating a pulse according to the input of said erasing signal; a first inverter gate which takes as an input said erasing signal; a first flip-flop circuit which is reset by an output signal of said erasing signal detection circuit and to which a block erase completion signal is input through a clock signal input terminal; a second flip-flop circuit which is reset by said output signal of said erasing signal detection circuit and a clock signal input terminal of which is connected to the input terminal of said first flip-flop circuit; a first NAND gate which takes as inputs the output signal of said second flip-flop circuit and said erasing signal; a second NAND gate which takes as inputs a normal address signal and the output signal of said first inverter gate; a fifth NAND gate which takes as inputs the output signals of said first and second NAND gates; a third NAND gate which takes as inputs the output signal of said first flip-flop circuit and said erasing signal; a fourth NAND gate which takes as inputs other normal address signal and the output signal of said first inverter gate; a sixth NAND gate which takes as inputs the output signals of said third and fourth NAND gates; a second inverter gate connected to the output terminal of said fifth NAND gate;

a third inverter gate connected to the output terminal of said sixth NAND gate; and a block selection decoder for generating a first to fourth output signal according to each output signal of said second inverter gate, fifth NAND gate, third inverter gate and sixth NAND gate.

BRIEF DESCRIPTION OF THE DRAWINGS

For fuller understanding of the nature and objects of the invention, reference should be had to the following detailed description taken in conjunction with the accompanying drawings in which.

DETAILED DESCRIPTION OF THE INVENTION

The present invention will be described below in detail with reference to the accompanying drawings.

Figure 1:
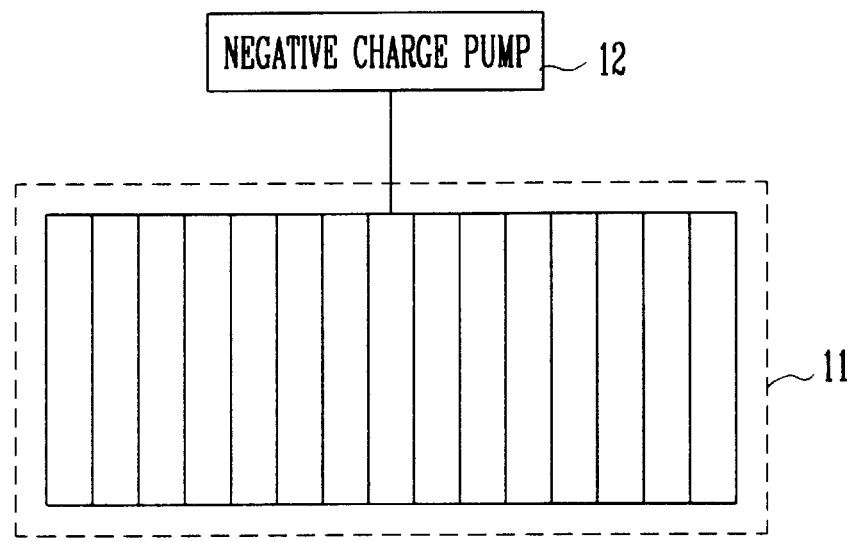
FIG. 1 is a block diagram to illustrate a conventional flash memory device.
Figure 3:
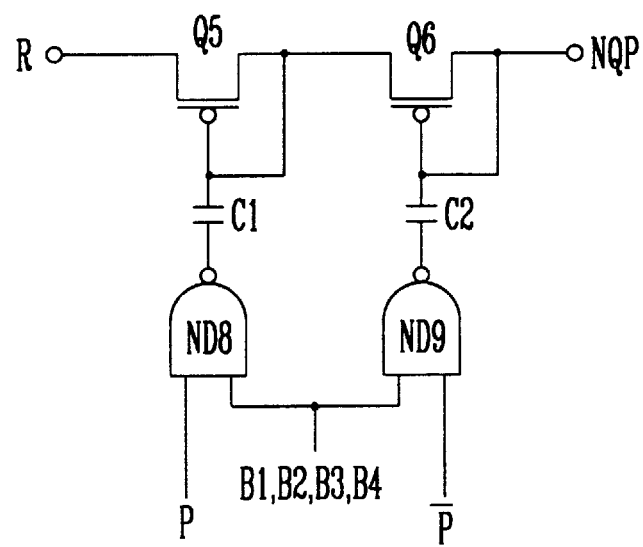
FIG. 3 is a detailed circuit diagram of the local pump circuit shown in FIG. 2.
Figure 2:
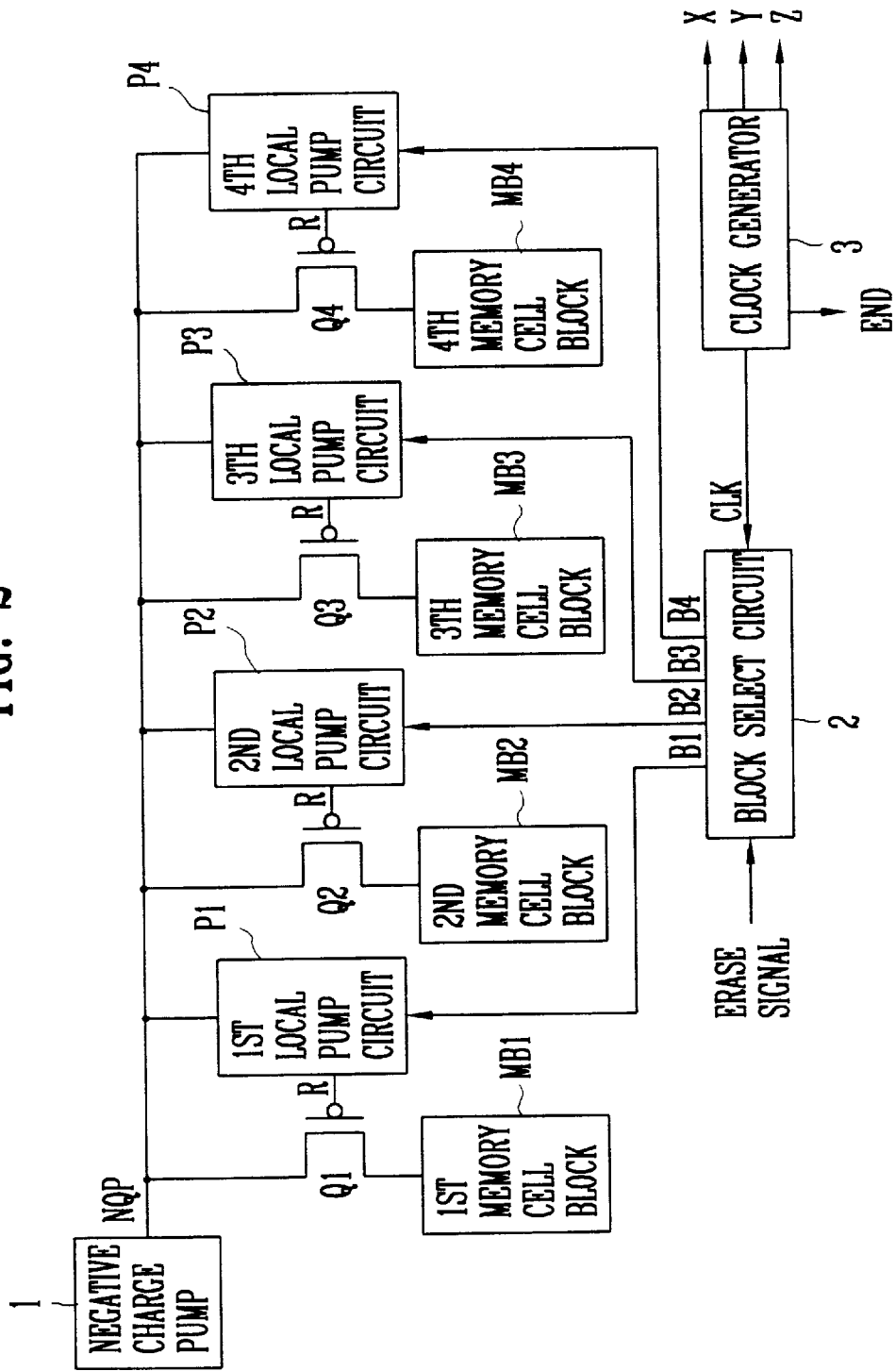
FIG. 2 is a block diagram to illustrate a flash memory device of the present invention.

FIG. 2 is a block diagram to illustrate a flash memory device of the present invention. The flash memory device shown in FIG. 2 will be described with reference to FIGS. 3 to 5.

A memory cell array of the flash memory device of the present invention is composed of a first to fourth memory cell blocks MB1 to MB4. A first to fourth switching circuits Q1 to Q4 which are respectively operated by the output signal R of a first to fourth local pump circuits P1 to P4 and composed of P-type MOS transistors are respectively connected between the first to fourth memory cell blocks MB1 to MB4 and an output terminal of a negative charge pump 1, and the first to fourth local pump circuits P1 to P4 are constructed so as to be selectively operated according to a first to fourth output signals B1 to B4 of a block selection circuit 2 which is operated by an erase signal and an output signal CLK of a clock generator 3.

To each of the first to fourth local pump circuits P1 to P4 are connected a first and second transistors Q5 and Q6 in series which are constructed to be operated by a diode between the output terminal NQP of the negative charge pump 1 and the output terminal R. A first capacitor C1 is connected between the gate terminal of the first transistor Q5 and the output terminal of the eighth NAND gate ND8. A second capacitor C2 is connected between the gate terminal of the second transistor Q6 and the output terminal of the ninth NAND gate ND9, and the output signal B3, B2, B3 or B4 of the block selection circuit 2 and the second pulse signal /p are respectively input to the input terminal of the NAND gate ND9. The first and second transistors Q5 and Q6 are composed of P-type MOS transistors, and the first pulse signal P and the second pulse signal /p have phases opposite to each other and are supplied at a constant period.

The second block selection circuit 2 is constructed in such a way that a first and second flip-flop circuits 5A, 5B are reset by the output signal of an erasing signal detection circuit 4 which generates a pulse according to the input of the erasing signal. To the clock signal input terminal CL of the first flip-flop circuit 5A is input the output signal CLK of the clock generator 3, and the input terminal D is connected to the clock signal input terminal CL of the second flip-flop 5B. Each input signal of a first NAND gate ND1 which receives an output signal Q of the second flip-flop 5B and the erasing signal and a second NAND gate ND2 which receives the erasing signal inverted by a first inverter gate G1 and a normal address signal An is input to a fifth NAND gate ND5, and each input of a third NAND gate ND3 which receives an output signal Q of the first flip-flop 5A and the erasing signal and a fifth NAND gate ND4 which receives the erasing signal inverted by the first inverter gate G1 and other normal address signal An+1 is input to a sixth NAND gate ND6. An output signal of the fifth NAND gate ND5, which is inverted by a second inverter gate G2, an output signal of the sixth NAND gate ND6, and an output of the sixth NAND gate ND6 which is inverted by a third inverter gate G3 are respectively input to a block selection decoder 6, and the first to fourth output signals B1 to B4 are output by the operation of the block selection decoder 6.

In the clock generator 3, a block erase completion signal Bep is input to a fourth inverter gate G4, and an output signal of the fourth inverter gate G4 and a reference clock signal RCK are input to a NOR gate G7. An output signal of the NOR gate G7 is input to the clock signal CLK output terminal through a fifth inverter gate G5, and the fourth output signal B4 and the block erase completion signal BEP are input to a seventh NAND gate ND7. An output signal of the seventh NAND gate ND7 is input to an erase completion signal END output terminal through a sixth inverter gate GG. The block erase completion signal BEP is input to a pulse generation portion 7, and an output signal of the pulse generation portion 7 is input to a status counter 8 which sequentially outputs an erase progress signal X, an erase verification signal Y and an erase comparison signal Z. Now, the erase operation of the flash memory device constructed as described above will be explained below.

Figure 4:
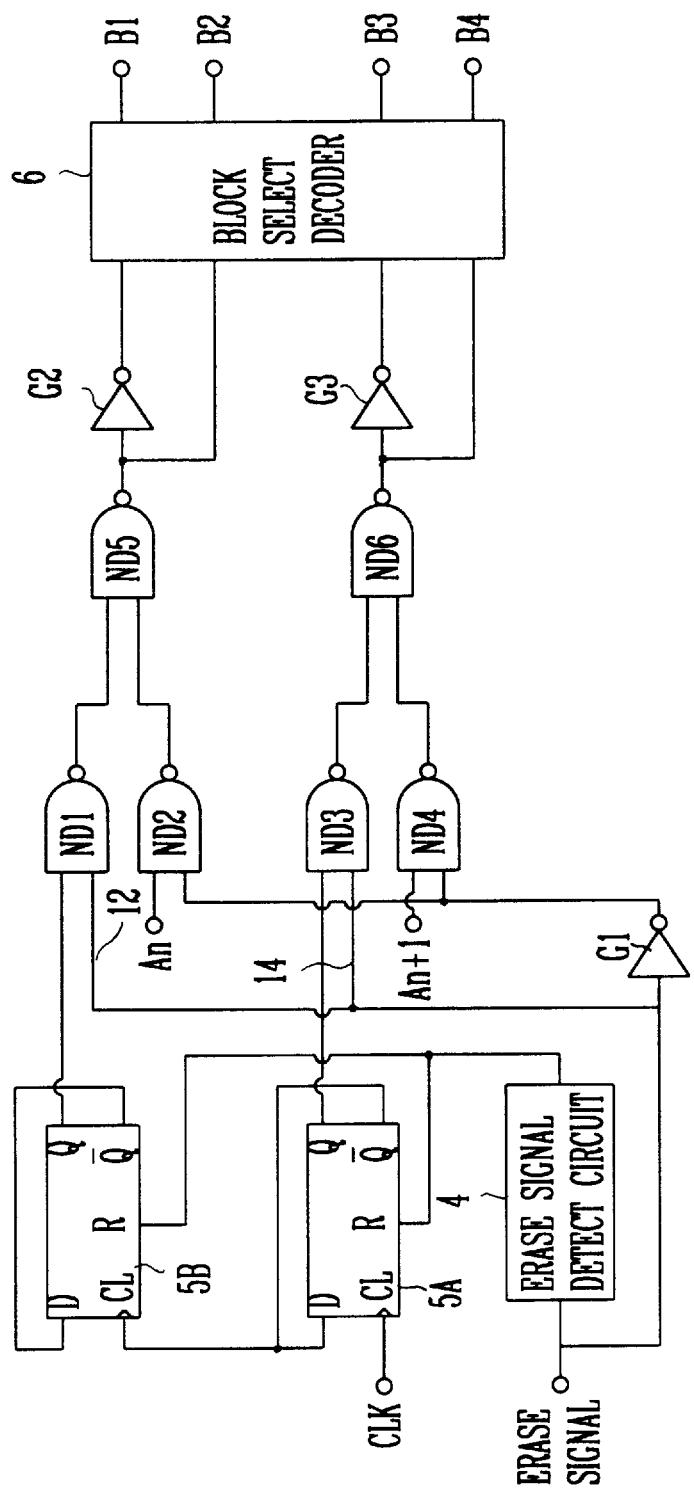
FIG. 4 is a detailed circuit diagram of the block selection circuit shown in FIG. 2.

First, if the erase signal of high state is input through the input terminal of the erase signal detection circuit 4 shown in FIG. 4, the first and second flip-flop circuits 5A, 5B are initialized by the output signal of the erase signal detection circuit 4, whereby only the first output signal B1 is output in high state from the block selection decoder 6. At this time, each of the first and second pulse signals P and /p is input through the input terminals of the eighth and ninth NAND gates ND8, ND9 of the first local pump circuit P1, whereby the first and second transistors Q5, Q6 are alternately operated. Therefore, since to the output terminal R of the first local pump circuit P1 is applied the output voltage of the negative charge pump 1 as lowered as much as the threshold voltage of the first and second transistors Q5, Q6 the first switching means Q1 is operated, and accordingly the output voltage of the negative charge pump 1 is supplied to the first memory cell block MB1 so that the erase operation is effectuated. At this time, the output voltage of the negative charge pump 1 is not supplied to the second to fourth memory cell blocks MB2 to MB4.

Figure 5:
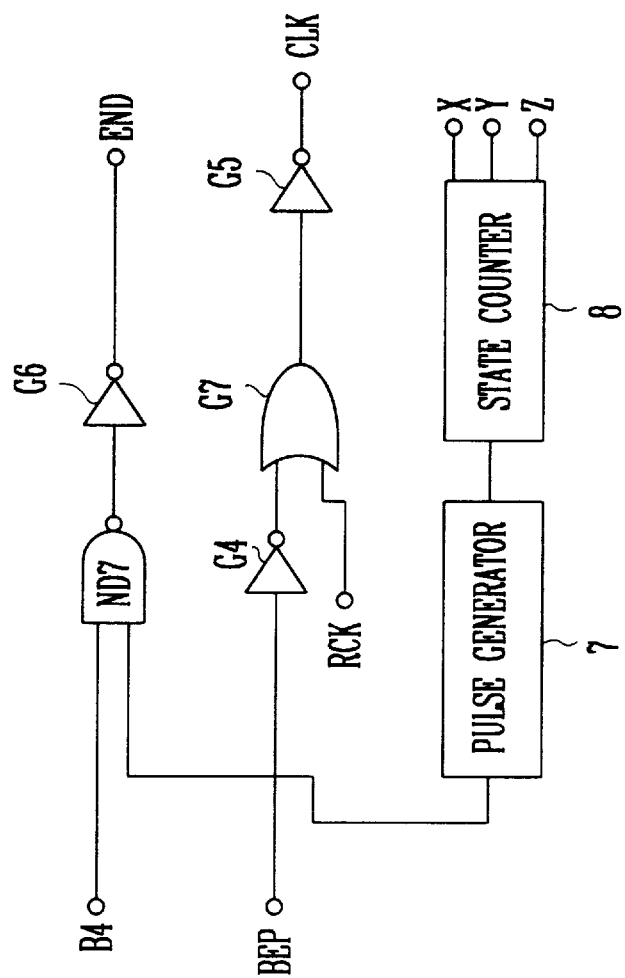
FIG. 5 is a detailed circuit diagram of the clock generator shown in FIG. 2.

If the erase of all the memory cells existing in the first memory cell block MB1, the block erase completion signal BEP is input to the fourth inverter gate G4 shown in FIG. 5. The output signal of the fourth inverter gate G4 and the reference clock signal RCK are each input to the NOR gate G7, and the output signal of the NOR gate G7 is inverted by the fifth inverter gate G5 and thereafter input to the clock signal input terminal CL of the first flip-flop circuit 5A shown in FIG. 4. At the same time, the pulse generation portion 7 which receives the block erase completion signal BEP operates the status counter 8 to sequentially regenerate the erase progress signal X, erase verification signal Y and erase comparison signal Z. According to the above described operation, only the second output signal B2 is output in high state from the block selection circuit 2. At this time, each of the first and second pulse signals P, /p is input through the input terminals of the eighth and ninth NAND gates ND8, ND9 of the second local pump circuit P2, whereby the first and second transistors Q5, Q6 are alternately operated. Therefore, since to the output terminal R of the second local pump circuit P2 is applied the output voltage of the negative charge pump 1 as lowered as much as the threshold voltage of the first and second transistors Q5, Q6, the second switching means Q2 is operated, and accordingly the output voltage of the negative charge pump 1 is supplied to the second memory cell block MB2 so that the erase operation is effectuated. At this time, the output voltage of the negative charge pump 1 is not supplied to the first, third and fourth memory cell blocks MB1, MB3, MB4.

If the erasing operation of the third and fourth memory cell blocks MB3, MB4 is completed according to the above described operation, the block erase completion signal BEP and the fourth output signal B4 are input to the seventh NAND gate ND7 of the clock generator 3. The output signal of the seventh NAND gate ND7 is inverted by the sixth inverter gate G6 and the clock generator 3 outputs the erase completion signal END according to the output signal of the sixth inverter gate G6.

As described above, the present invention is constructed in such a way that the memory cell blocks are sequentially selected according to the input of the erasing signal and the output voltage of the negative charge pump is supplied only to the selected memory cell block to prevent the degradation of the operational performance of the device due to excessive load applied to the output terminal of the negative charge pump at the time of erase operation. Therefore, the present invention has excellent effects that the magnitude of the load applied to the output terminal of the negative charge pump is reduced to 1/N of that of the conventional device (N refers to the number of memory cell blocks), and accordingly, the degradation of operational performance of the device can be prevented.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising:
    a memory cell array composed of a plurality of memory cell blocks;
    a negative charge pump;
    a plurality of switching circuits coupled between said negative charge pump and said memory cell blocks;
    a plurality of local pump circuits for operating said plurality of switching circuits; and
    a block selection circuit for sequentially operating said local pump circuits according to the input of an erasing signal.

2. The device of claim 1, wherein said switching circuits are composed of P-type MOS transistors.

3. The device of claim 1, wherein said local pump circuit is composed of:
    first and second transistors constructed to be operated by diodes between an output terminal of said negative charge pump and an output terminal of said local pump circuit;
    a first NAND gate which takes as inputs an output signal of said block selection circuit and a first pulse signal;
    a first capacitor connected between a gate terminal of said first transistor and an output terminal of said first NAND gate;
    a second NAND gate which takes as inputs an output signal of said block selection circuit and a second pulse signal; and
    a second capacitor connected between a gate terminal of said second transistor and an output terminal of said second NAND gate.

4. The device of claim 3, wherein said first and second transistors are P-type MOS transistors.

5. The device of claim 3, wherein said first pulse signal and second pulse signal have phases opposing to each other and are supplied at a constant period.

6. The device of claim 1, wherein said block selection circuit is composed of:

an erasing signal detection circuit for generating a pulse according to the input of said erasing signal;
a first inverter gate which takes as an input said erasing signal;
a first flip-flop circuit which is reset by an output signal of said erasing signal detection circuit and to which a clock signal is input through a clock signal input terminal;
a second flip-flop circuit which is reset by said output signal of said erasing signal detection circuit and which is connected to an input terminal of said first flip-flop circuit through a clock signal input terminal;
a first NAND gate which takes as inputs an output signal of said second flip-flop circuit and said erasing signal;
a second NAND gate which takes as inputs a normal address signal and an output signal of said first inverter gate;
a third NAND gate which takes as inputs an output signal of said first flip-flop circuit and said erasing signal;
a fourth NAND gate which takes as inputs an other normal address signal and the output signal of said first inverter gate;
a fifth NAND gate which takes as inputs output signals of said first and second NAND gates;
a sixth NAND gate which takes as inputs output signals of said third and fourth NAND gates;
a second inverter gate connected to an output terminal of said fifth NAND gate;
a third inverter gate connected to an output terminal of said sixth NAND gate; and
a block selection decoder for generating a first to fourth output signal according to output signals of said second inverter gate, fifth NAND gate, third inverter gate and sixth NAND gate.

7. A flash memory device comprising:
    a memory cell array composed of a plurality of memory cell blocks;
    a negative charge pump;
    a plurality of switching circuits connected between said negative charge pump and said memory cell blocks;
    a plurality of local pump circuits for operating said plurality of switching circuits;
    a clock generator for outputting a clock signal and an erase completion signal according to the input of block erase completion signal;
    a block selection circuit for sequentially operating said local pump circuits according to the input of an erasing signal and said clock signal.

8. The device of claim 7, wherein said switching circuits are composed of P-type MOS transistors.

9. The device of claim 7, wherein said local pump circuit is composed of:
    first and second transistors constructed to be operated by diodes between an output terminal of said negative charge pump and an output terminal of said local pump circuit;
    a first NAND gate which takes as inputs an output signal of said block selection circuit and a first pulse signal;
    a first capacitor connected between a gate terminal of said first transistor and an output terminal of said first NAND gate;
    a second NAND gate which takes as inputs an output signal of said block selection circuit and a second pulse signal; and a second capacitor connected between a gate terminal of said second transistor and an output terminal of said second NAND gate.

10. The device of claim 9, wherein said first and second transistors are P-type MOS transistors.

11. The device of claim 9, wherein said first pulse signal and second pulse signal have phases opposing to each other and are supplied at a constant period.

12. The device of claim 7, wherein said clock generator is composed of:

a first inverter gate which takes as an input said block erase completion signal;

a NOR gate which takes as inputs the output signal of said first inverter gate and a reference clock signal;

a second inverter gate which takes as an input the output signal of said NOR gate and outputs said clock signal;

a NAND gate which takes as inputs said block erase completion signal and an output signal of said block selection circuit;

a third inverter gate which takes as an input the output signal of said NAND gate and outputs said erase completion signal;

a pulse generator which takes as an input said block erase completion signal; and a state counter for sequentially outputting an erase progress signal, an erase verification signal and an erase comparison signal according to an output signal of said pulse generator.

13. The device of claim 7, wherein said block selection circuit is composed of:

an erasing signal detection circuit for generating a pulse according to the input of said erasing signal;

a first inverter gate which takes as an input said erasing signal;

a first flip-flop circuit which is reset by an output signal of said erasing signal detection circuit and to which a clock signal is input through a clock signal input terminal;

a second flip-flop circuit which is reset by said output signal of said erasing signal detection circuit and which is connected to the input terminal of said first flip-flop circuit through a clock signal input terminal;

a first NAND gate which takes as inputs an output signal of said second flip-flop circuit and said erasing signal;

a second NAND gate which takes as inputs a normal address signal and an output signal of said first inverter gate;

a third NAND gate which takes as inputs an output signal of said first flip-flop circuit and said erasing signal;

a fourth NAND gate which takes as inputs an other normal address signal and the output signal of said first inverter gate;

a fifth NAND gate which takes as inputs output signals of said first and second NAND gates;

a sixth NAND gate which takes as inputs output signals of said third and fourth NAND gates;

a second inverter gate connected to an output terminal of said fifth NAND gate;

a third inverter gate connected to an output terminal of said sixth NAND gate; and a block selection decoder for generating a first to fourth output signal according to output signals of said second inverter gate, fifth NAND gate, third inverter gate, and sixth NAND gate.

* * * * *